US009017632B2

(12) United States Patent
Twitchen et al.

(10) Patent No.: US 9,017,632 B2
(45) Date of Patent: Apr. 28, 2015

(54) DIAMOND MATERIAL

(75) Inventors: Daniel James Twitchen, Berkshire (GB); Sarah Louise Geoghegan, Berkshire (GB); Neil Perkins, Berkshire (GB)

(73) Assignee: Element Six Technologies Limited (GB)

( * ) Notice: Subject to any disclaimer, the term of this patent is extended or adjusted under 35 U.S.C. 154(b) by 660 days.

(21) Appl. No.: 12/823,576

(22) Filed: Jun. 25, 2010

(65) Prior Publication Data

US 2010/0329965 A1 Dec. 30, 2010

Related U.S. Application Data

(60) Provisional application No. 61/220,663, filed on Jun. 26, 2009, provisional application No. 61/247,735, filed on Oct. 1, 2009, provisional application No. 61/310,639, filed on Mar. 4, 2010, provisional application No. 61/320,023, filed on Apr. 1, 2010, provisional application No. 61/332,878, filed on May 10, 2010.

(51) Int. Cl.
| | |
|---|---|
| *B01J 3/06* | (2006.01) |
| *A62D 3/00* | (2007.01) |
| *C30B 23/00* | (2006.01) |
| *H01L 21/322* | (2006.01) |
| *C30B 28/06* | (2006.01) |
| *C23C 16/27* | (2006.01) |

(Continued)

(52) U.S. Cl.
CPC ............. *C23C 16/278* (2013.01); *A44C 17/008* (2013.01); *C23C 16/27* (2013.01); *C23C 16/56* (2013.01); *C30B 25/105* (2013.01); *C30B 29/04* (2013.01); *C30B 31/20* (2013.01)

(58) Field of Classification Search
None
See application file for complete search history.

(56) References Cited

U.S. PATENT DOCUMENTS

| | | | |
|---|---|---|---|
| 2,945,793 A | 7/1960 | Dugdale | |
| 4,959,201 A | 9/1990 | Satoh et al. | |

(Continued)

FOREIGN PATENT DOCUMENTS

| | | |
|---|---|---|
| EP | 0 275 063 A2 | 11/1988 |
| EP | 0 316 856 A1 | 11/1988 |

(Continued)

OTHER PUBLICATIONS

Taylor et al.; The Derivation of Hue-Difference Terms from CIELAB Coordinates; Color Research and Application; vol. 6, No. 2, pp. 75-77; 1981.*

(Continued)

*Primary Examiner* — Guinever Gregorio
(74) *Attorney, Agent, or Firm* — Bryan Cave LLP

(57) ABSTRACT

A method of making fancy pale blue or fancy pale blue/green CVD diamond material is described. The method comprises irradiating single crystal diamond material that has been grown by a CVD process with electrons to introduce isolated vacancies into the diamond material, the irradiated diamond material having (or after a further post-irradiation treatment having) a total vacancy concentration $[V_T]$ and a path length L such that $[V_T] \times L$ is at least 0.072 ppm cm and at most 0.36 ppm cm, and the diamond material becomes fancy pale blue or fancy pale blue/green in color. Fancy pale blue diamonds are also described.

21 Claims, 4 Drawing Sheets

Figure 1:
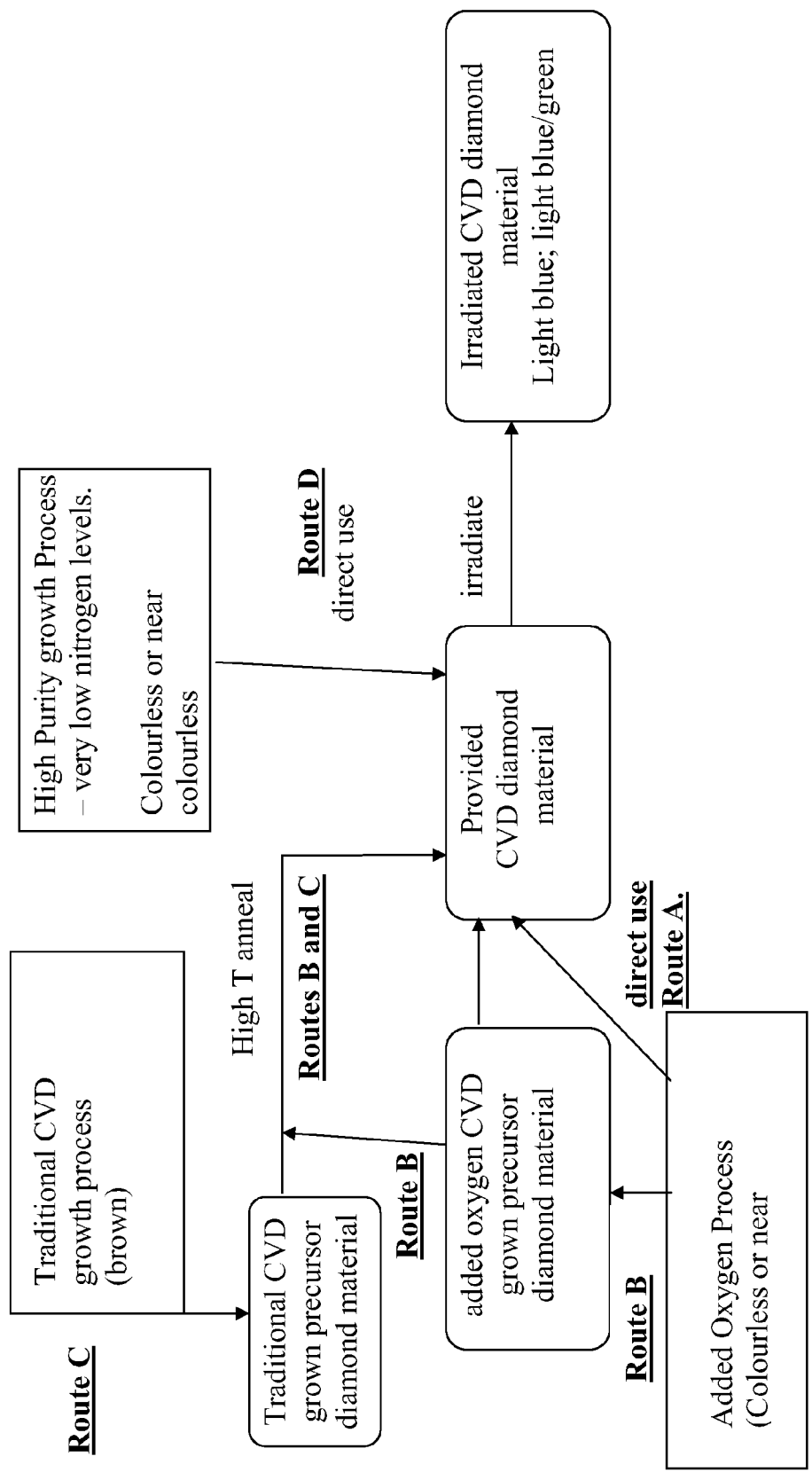

(51) Int. Cl.

| | | |
|---|---|---|
| *C23C 16/56* | (2006.01) | |
| *C30B 25/10* | (2006.01) | |
| *C30B 29/04* | (2006.01) | |
| *C30B 31/20* | (2006.01) | |
| *A44C 17/00* | (2006.01) | |

(56) References Cited

U.S. PATENT DOCUMENTS

| | | | |
|---|---|---|---|
| 5,451,430 | A | 9/1995 | Anthony et al. |
| 5,672,395 | A | 9/1997 | Anthony et al. |
| 6,030,595 | A * | 2/2000 | Sumiya et al. ........ 423/446 |
| 7,122,837 | B2 | 10/2006 | Linares et al. |
| 7,160,617 | B2 * | 1/2007 | Scarsbrook et al. ........ 428/408 |
| 7,172,655 | B2 | 2/2007 | Twitchen et al. |
| 7,964,280 | B2 | 6/2011 | Williams et al. |
| 2002/0172638 | A1 | 11/2002 | Vagarali et al. |
| 2004/0175499 | A1 | 9/2004 | Twitchen et al. |
| 2004/0194690 | A1 * | 10/2004 | Twitchen et al. ........ 117/68 |
| 2004/0229464 | A1 | 11/2004 | Godfried et al. |
| 2005/0181131 | A1 * | 8/2005 | Linares et al. ........ 427/249.8 |
| 2006/0292302 | A1 * | 12/2006 | Chodelka et al. ........ 427/248.1 |
| 2007/0053823 | A1 | 3/2007 | Vins |
| 2007/0092647 | A1 | 4/2007 | Scarsbrook et al. |
| 2008/0241049 | A1 | 10/2008 | Hemley et al. |
| 2010/0028556 | A1 | 2/2010 | Linares et al. |
| 2010/0104494 | A1 | 4/2010 | Meng et al. |

FOREIGN PATENT DOCUMENTS

| | | |
|---|---|---|
| EP | 0 615 954 A1 | 8/1994 |
| EP | 0 671 482 A1 | 3/1995 |
| EP | 1 990 313 A1 | 10/2007 |
| GB | 2 430 194 A | 5/2003 |
| GB | 743584 A | 3/2007 |
| JP | 2 571 797 B2 | 11/1987 |
| JP | 62296875 | 11/1987 |
| JP | 2 184 600 A | 1/1989 |
| JP | 64 020689 | 1/1989 |
| JP | 01 131014 A | 5/1989 |
| JP | 01-138112 A | 5/1989 |
| JP | 2 000 385 | 1/1990 |
| JP | 06 263418 | 9/1994 |
| JP | 2005 512929 A | 5/2005 |
| JP | 2005 538018 A | 12/2005 |
| JP | 2006 507204 A | 3/2006 |
| JP | 2010 526746 A | 8/2010 |
| KR | 10-2008-0089734 A | 10/2008 |
| RU | 2145365 C1 | 2/2000 |
| WO | 99 67171 | 12/1999 |
| WO | 01 96633 A1 | 12/2001 |
| WO | 01 96634 A1 | 12/2001 |
| WO | 03 014427 A1 | 2/2003 |
| WO | 03 052177 A1 | 6/2003 |
| WO | 2004 022821 A1 | 3/2004 |
| WO | 2004 046427 A1 | 3/2004 |
| WO | 2007 009037 A1 | 1/2007 |
| WO | 2010 010344 A1 | 1/2010 |
| WO | 2010 010352 A1 | 1/2010 |

OTHER PUBLICATIONS

De Weerdt et al, "Defects in coloured natural diamonds," Diamond and Related Materials, 10, 2001, pp. 474-479.
G. Davies, "Current problems in diamond: towards a quantitative understanding," Physica B. 273-274, 1999, pp. 15-23.
King, et al., "Color grading of colored diamonds in the GIA gem trade laboratory," Gems & Gemology, vol. 30, No. 4, 1994, pp. 220-242.
P. Von Fritz, "Uber Brechungsindizes und Absorptionskonstanten des Diamanten zwischen 644 und 288 mu1). ," Z. Phys. 15, 1923, pp. 358-368.
Howarth, et al., "Generalization of the lineshape useful in magnetic resonance spectroscopy," J. Magn. Res., 161, 2003, pp. 215-221.
Hyde, et al., "Pseudo Field Modulation in EPR Spectroscopy," Appl. Magn. Reson., 1, 1990, pp. 483-496.
Wyszecki, et al., "Color Science Concepts and Methods, Quantitative Data and Formulas," New York; London-Sydney, 1967, pp. 9, 242-251.
Commission Internationale de L'Eclairage, "Colorimetry," 1986, pp. 27-33.
Pagel-Theisen et al., "Diamond Grading ABC The Manual," Rubin & Son, Belgium, 9th Edition, 2001, pp. 64-67.
Bradlow et al., "Asymmetry of the GR1 line in type IIA diamond," Solid State Communications, vol. 38, 1981, pp. 247-249.
Collins et al., "The annealing of radiation damage in De Beers colourless CVD diamond," Diamond and Related Materials, vol. 3, No. 4-6,1994, pp. 932-935.
Fritsch, et al., "Thermochromic and photochromic behavior of "chameleon" diamonds," Diamond and Related Materials, vol. 16, 2007, pp. 401-408.
Kennedy, et al., "Long coherence times at 300 K for nitrogen-vacancy center spins in diamond grown by chemical vapor deposition," Applied Physics Letters, vol. 83, No. 20, 2003, pp. 4190-4192.
Nelder, et al., "A simplex method for function minimization," The Computer Journal, 7, 1965, pp. 308-313.
Walderman et al., "Creating diamond color centers for quantum optical applications," Diamond and Related Materials, vol. 16, 2007, pp. 1887-1895.
J. Walker, "Optical absorption and luminescence in diamond," Rep. Prog. Phys 1979, 42, pp. 1605-1659.
Wang, "CVD Grown Pink Diamonds," GIA Laboratories, Apr. 2009, pp. 1-3.
PCT Search Report for PCT/EP2010/059078 dated Sep. 27, 2010.
PCT Search Report for PCT/EP2010/059080 dated Aug. 26, 2010.
PCT Search Report for PCT/EP2010/059081 dated Sep. 22, 2010.
PCT Search Report for PCT/EP2010/059084 dated Sep. 20, 2010.
Search Report for GB1005573.9 dated Jul. 29, 2010.
Search Report for GB0911075.0 dated Oct. 29, 2009.
Search Report for GB1003613.5 dated Jun. 30, 2010.
Stesmans et al., "Chemical Vapour Deposition Diamond Studied by Optical and Electron Spin Resonance Techniques," J. Physics; Condes. Matter; vol. 14, 2002, pp. R467-R499.

* cited by examiner

DIAMOND MATERIAL

This invention relates to a method of making fancy pale blue or fancy pale blue/green diamond material by irradiating diamond material that has been made by a CVD (chemical vapour deposition) process. The invention also relates to a fancy pale blue or fancy pale blue/green CVD diamond material per se. The invention further provides a system for being able to make a desired colour of diamond material within the fancy blue to blue/green colour range.

The term "fancy-coloured diamond" is a well-established gem trade classification and is used to refer to unusual coloured diamonds. A useful history and background to the grading of fancy coloured diamond gemstones, including the use of Munsell colour charts is given by King et al, in Gems & Gemology, Vol. 30, No. 4, 1994 (pp. 220-242).

Diamond materials that exhibit a pronounced amount of colour are known as "fancy" coloured diamonds in the field. Other diamond materials that do not show such pronounced colour may be graded using the Gemological Institute of America (GIA) scale. That scale grades diamond materials alphabetically from D to Z. The GIA scale is well known. D represents the highest grade and most colourless diamond material on the GIA scale, and Z represents the lowest grade on the GIA scale, diamond material of grade Z appearing light yellow to the naked eye. Higher grade diamond materials (those on the GIA scale nearer to grade D) are generally considered more desirable than lower grade diamond materials (those nearer to grade Z), both in the gem trade and for industrial applications. When the colour of diamond material is more intense that the Z grading it is termed a "fancy" diamond whatever its colour. However when an attractive colour such as blue is seen in diamond material it is frequently described as fancy coloured diamond, even though its saturation may be such as to grade it earlier in the alphabet than Z. When grading according to the GIA scale, diamond graders use a master set of diamond stones graded D, E, F etc up to Z, and ranging in colour from colourless (for all grades up to F) through pale yellows to darker yellows (G to Z). The diamond material to be graded is compared against the master set, and then positioned against its nearest stone in the master set according to its colour saturation. That establishes the colour grade letter for the diamond to be graded, e.g. H or K. After that colour grade letter has been established, for grades from G-Z the colour-grader will also establish a colour to accompany the colour-grade letter. This colour might be for example, brown, yellow, or blue. Thus, for example, a stone might be graded H (brown), if its colour saturation puts it nearest to the H stone in the colour-grader's master set of colourless to dark yellow stones, and it has a noticeable brown colouration. In terms of colour designations brown stones have a hue angle in the range 0° to less than 90°, and yellow stones have a hue angle in the range 90°-130°.

Naturally occurring blue diamonds are known. Type IIb diamond material which contains substantially no nitrogen, but does contain boron, absorbs red, orange and yellow light. This diamond material therefore usually appears blue. The introduction in EP0615954A (Sumitomo) includes a table setting out the original colours of various natural rough diamonds including type IIb natural blue diamonds.

It is also known to form fancy coloured diamonds, including blue by treating diamonds that are not originally blue. For example, "Optical Absorption and Luminescence" by John Walker, "Reports on Progress in Physics", Volume 42, 1979. describes inter alia that irradiation of any diamond produces a blue-green colouration due to the absorption bands in the red and violet part of the absorption spectrum. This so-called GR1 absorption band is understood to be caused by neutral isolated vacancies $V^0$ in the diamond structure, each isolated vacancy being known as a "GR1 centre". The strength of the GR1 band is linearly related to the irradiation dose, indicating that the GR1 centre is a purely lattice defect and not related to any impurity in the diamond. The blue-green colouration of diamond material caused by irradiation is exemplified in the Walker publication.

EP615954A and EP316856A describe irradiation of synthetic High Pressure/High Temperature (HPHT) diamond material with an electron beam or a neutron beam to form lattice defects (interstitials and isolated vacancies) in the crystal. Thereafter the diamond crystal is annealed in a prescribed temperature range to form colour centres. These publications describe the production of purple and red/pink diamond materials.

One embodiment of the invention provides a method of making fancy pale blue or fancy pale blue/green CVD single crystal diamond material, the method comprising irradiating single crystal diamond material that has been grown by a CVD process, has a $[N_s^0]$ concentration less than 1 ppm, and is colourless, or is colour-graded brown or yellow, and if colour-graded brown has a colour grade for a 0.5 ct Round Brilliant Cut diamond stone of G (brown) or better, and if colour-graded yellow has a colour grade for a 0.5 ct Round Brilliant Cut diamond stone of T (yellow) or better, with electrons to introduce isolated vacancies into the diamond material, the irradiated single crystal CVD diamond material having, or after a further post irradiation annealing treatment having, a total vacancy concentration $[V_T]$ and a path length, L such that the product of the total isolated vacancy concentration×path length, $[V_T] \times L$ is at least 0.072 ppm cm and at most 0.36 ppm cm, and the diamond material becomes fancy pale blue or fancy pale blue/green in colour.

The term $N_s^0$ refers to single substitutional nitrogen atoms in the diamond material.

The perceived colour of any particular diamond stone depends on the size and cut of the diamond. Therefore, where reference is given to the colour-grade of diamond material it is usual in the field to quote this in terms of a standard size, usually 0.5 carat, and a standard cut, usually round brilliant cut (often known as RBC or rbc). For any given diamond stone, be it larger or smaller than 0.5 carat, or round brilliant cut or any other cut, models are available to adjust the colour-grade to that for the standard size and cut. Therefore, diamond material used in the method according to the first aspect of the invention may have any size or cut, but its colour grade where specified is adjusted to the colour grade for that diamond material of standard 0.5 carat size, and standard round brilliant cut.

The product of isolated vacancy concentration×path length limits can be expressed as:

$$0.36 \text{ ppm cm} \leq [V_T] \times L > 0.072 \text{ ppm cm}$$

Knowing that 1 ppm=$1.76 \times 10^{17}$ cm$^{-3}$ this can alternatively be written as:

$$2.04 \times 10^{-18} \text{ cm}^{-2} \geq [V_T] \times L \geq 4.09 \times 10^{-19} \text{ cm}^{-2}$$

The path length for a round brilliant polished gem is assumed to be 2 times the depth of the stone. For example, for a 0.5 ct round brilliant cut diamond material with a stone depth of 0.3 cm and therefore an average path length of 0.6 cm—the limits would be:

$$0.6 \text{ ppm} \geq [V_T] \geq 0.12 \text{ ppm}$$

The CVD diamond prior to the irradiation step is referred to sometimes in this specification as "the provided CVD diamond". The step of actually growing the CVD diamond material may or may not form part of the method of embodiments of the invention. Providing a CVD diamond material may simply mean, for example, selecting a pre-grown CVD diamond material.

The provided CVD diamond material in the method of the present invention has a $[N_s^0]$ concentration (that is a concentration of single substitutional nitrogen defects) less than 1 ppm. The colour of the provided CVD diamond material may vary according to the $[N_s^0]$ concentration, and the manner in which the diamond material has been grown. It is known that $[N_s^0]$ defects themselves introduce a yellow colouration into diamond material, particularly at concentrations greater than 0.3 ppm in stones bigger than a 0.3 ct rbc.

It is also known that the presence of the low concentrations of nitrogen in a CVD growth environment can affect the nature and concentration of other defects that are incorporated in a CVD synthetic diamond material as the diamond material grows, and that at least some of these other defects provide colour centres contribute to the colour of CVD diamond material, typically introducing a brown colouration to the diamond material.

It is also known that these colour centres that contribute to the brown colouration of CVD diamond grown in the presence of low concentrations of nitrogen are unique to single crystal CVD diamond, or to pieces cut or produced from layers of single crystal CVD diamond. It is furthermore known that the colour centres contributing to brown colouration in CVD diamond are different from those contributing to any brown colouration observed in natural diamond because the defects in the CVD diamond material cause absorption bands in the absorption spectra of the grown CVD diamond material that are not found in the absorption spectra of natural diamond. Evidence for this comes from Raman scattering from non-diamond carbon observable with an infrared excitation source (e.g. 785 nm or 1064 nm) which is not observed for brown natural diamond. Further, it is known that these colour centres in natural diamond material anneal at a different temperature to those in CVD diamond material.

It is believed that some of the colour centres contributing to the brown colouration seen in CVD synthetic diamond grown in processes in which low concentrations of nitrogen are introduced relate to localised disruption of the diamond bonding within the single crystal CVD diamond. The exact nature of the defects is not fully understood, but the use of electron paramagnetic resonance (EPR) and optical absorption spectroscopy techniques have been used to study the nature of the defects and improve our understanding somewhat. The presence of the nitrogen in the grown CVD synthetic diamond material can be evidenced by looking at absorption spectra for the grown CVD diamond material, and analysis of these spectra gives some indication of the relative proportions of different types of defect present. A typical spectrum for grown CVD synthetic diamond material grown with nitrogen added to the synthesis environment shows a peak at about 270 nm, which is generated by the presence of neutral single substitutional nitrogen)($N_s^0$) atoms in the diamond lattice. Additionally peaks have been observed at about 350 nm and approximately 510 nm corresponding to other defects characteristic and unique to CVD synthetic diamond material, and furthermore a so-called "ramp", that is a rising background of the form $c \times \lambda^{-3}$ has been observed, where c is a constant and λ is the wavelength. While the $N_s^0$ is primarily identifiable by its peak at 270 nm, it also contributes in smaller amounts to the absorption spectrum at higher wavelengths, in particular at wavelengths in the visible part of the spectrum, which is generally considered to cover the wavelength range 350 nm to 750 nm.

It is the combination of features evident in the visible part of the absorption spectrum of the CVD diamond material, i.e. (a) the $N_s^0$ contribution in the visible part of the spectrum, (b) the 350 nm peak, (c) the 510 nm peak and (d) the ramp feature, that affect the perceived colour of the diamond material and are believed to be responsible for the brown colour typically seen in nitrogen doped CVD synthetic diamond material. The peaks at 350 nm and 510 nm, are not seen in the absorption spectra of natural diamonds, nor in the absorption spectra of other synthetic diamonds, for example synthetic HPHT diamonds of the type described in EP615954A. For the purposes of this specification, all defects other than the $N_s^0$ defects that contribute to the absorption spectrum in the visible part of the spectrum, which we have discussed above as the 350 nm, 510 nm and ramp features, will be referred to collectively as "X defects". As noted above, at this time the structural nature of these defects at an atomic level is not understood, merely their effect on the grown diamond material's absorption spectra. Without binding the invention in any way, it is thought that the nature of the defects responsible for the brown colouration might be related to the presence of multi-vacancy clusters (each cluster being made up of tens of vacancies e.g. 30 or 40 vacancies or more) that are grown-in under large growth rates, concomitant with the addition of nitrogen to the plasma to a hydrogen/methane ($H_2/CH_4$) source gas. Such clusters are thermally unstable and may be removed to some degree, by high-temperature treatment (i.e. annealing). It is thought that smaller vacancy-related defects, such as a NVH⁻ (nitrogen-vacancy-hydrogen) defects that are made up of nitrogen and hydrogen and a missing carbon atom, may be partially responsible for the brown colour and these defects may also be removed by high-temperature treatment.

Depending on the method of manufacture, and the $[N_s^0]$ concentration, the provided CVD diamond material used in methods according to the invention may appear colourless, near colourless, pale yellow, or pale brown. According to methods of the present invention, the colour of the provided CVD diamond is graded either colourless or brown or yellow, and if brown is graded G (brown) or better, and if yellow is graded T (yellow) or better (for a 0.5 carat round brilliant cut—RBC) using the Gemological Institute of America (GIA) scale. As noted above that scale grades diamond materials alphabetically from D to Z, diamond material being colour-graded by comparing their colour intensity or saturation (rather than the actual hue—e.g. yellow or brown) to stones of known saturation under controlled lighting and precise viewing conditions. D represents the highest grade and most colourless diamond material on the GIA scale and Z represents the lowest grade on the GIA scale, diamond material of grade Z typically appearing pale yellow or brown to the naked eye. Higher grade diamond materials (those on the GIA scale nearer to grade D) are generally considered more desirable than lower grade diamond materials (those nearer to grade Z), both in the gem trade and for other applications; therefore when we say graded G or better we mean graded G or a letter earlier in the alphabet than G. Diamond materials with a yellow or brown hue are graded alphabetically on the same scale and against the same master set of diamonds for each colour-grade. Therefore a grade of G (brown) means there is some colour and the colour component is brown. Diamond material graded G (yellow) would have the same amount of colour as diamond material graded G (brown) but the colour component would be yellow rather than brown. Typically brown diamond material has a hue angle <90°, and yellow diamond material has a hue angle between 90-130°. Diamond material graded F or better has no visible colour and is graded alphabetically only, or alphabetically followed by "colourless" in parentheses. If diamond material has a colour with a yellow or brown hue that is more intense than the Z grading it enters the realm of "fancy" coloured diamond material. As noted above, diamond material with a detectable hue other than yellow or brown, such as blue, which has a colour strong enough to be recorded, is also referred to as being "fancy". Diamond material with a blue hue will therefore be termed "fancy" when the intensity of colour is lower than would be the case for yellow or brown coloured diamond.

According to the present invention, a colour grade of G or better is advantageous for any brown provided diamond material, in order after irradiation to achieve a fancy pale blue diamond material. On the other hand, a colour grade of T or better is advantageous for any yellow provided diamond material, this resulting in a fancy pale blue/green diamond material after irradiation. The amount of yellow in the provided diamond material may be increased by increasing the $[N_s^0]$ concentration, providing this can be done without increasing the X defects, and their associated brown colouration. We have advantageously been able to grow CVD diamond with low and controlled levels of nitrogen whilst keeping the concentration of X defects to a minimum. This is not trivial for CVD growth. It advantageously not only provides nitrogen in the CVD growth process which may be advantageous for morphology reasons, but also for some embodiments allows sufficient nitrogen to be present to provide a yellow hue in the provided diamond, which after irradiation according to the invention results in a pale blue/green diamond material. We have advantageously discovered that it is possible to control the nitrogen concentration in the CVD diamond to within 20% of the target whilst maintaining a low concentration of brown defects. This advantageously allows the hue angle of the treated (irradiated) diamond material to be controlled in the range of blue to blue-green as desired.

An alternative or additional manner of defining the colour of the provided CVD diamond material is in terms of its room temperature absorption spectrum. It is advantageous if the above-mentioned X-defects are minimised, and contribute little to the absorption spectrum of the provided diamond material. Typically, where $[N_s^0]$ concentrations are greater than 0.1 ppm in the provided diamond material, but less than 1 ppm, it is preferred that the total integrated absorption in the visible range from 350 nm to 750 nm that is attributable to defects other than $N_s^0$ is less than 90%, i.e. the brown inducing X-defects are minimised. Where $[N_s^0]$ concentrations are zero or very low, for example less than 0.1 ppm, the total integrated absorption in the visible range from 350 nm to 750 nm that is attributable to defects other than $N_s^0$ is likely to be greater than 90% even if the brown-inducing X-defects are very low, simply because $[N_s^0]$ concentrations alone are zero or very low. In these cases it is advantageous if the absorption coefficient (when the spectra have been normalised to 0 cm$^{-1}$ at 800 nm) at 350 nm is less than 0.5 cm$^{-3}$ and at 510 nm is less than 0.3 cm$^{-3}$, these low absorption coefficients being an indicator of a low level of brown inducing X-defects in the diamond material. It is noted that where $[N_s^0]$ concentrations are greater than 0.1 ppm the absolute values of the absorption coefficients at 350 nm and 510 nm could be greater than 0.5 and 0.3 cm$^{-1}$ respectively even when [X defect] concentrations are low, because of the contribution to the absorption spectra at the 350 nm and 510 nm wavelengths from the $N_s^0$ defects themselves.

Another aspect of the present invention provides a method of making fancy pale blue or fancy pale blue/green CVD single crystal diamond material comprising the steps of:

i) providing single crystal diamond material that has been grown by a CVD process, the diamond material having a $[N_s^0]$ concentration less than 1 ppm, wherein the total integrated absorption in the visible range from 350 nm to 750 nm that is attributable to defects other than $N_s^0$ is greater than 90% then the absorption coefficient at 350 nm is less than 0.5 cm$^{-1}$ and the absorption coefficient at 510 nm is less than 0.3 cm$^{-1}$ and (ii) irradiating, the provided CVD diamond material with electrons so as to introduce isolated vacancies into the diamond material, so that the product of the total vacancy concentration×path length, $[V_T] \times L$ in the irradiated diamond material at this stage, or after a further post-irradiation treatment, being at least 0.072 ppm cm and at most 0.36 ppm cm, whereby the diamond material becomes fancy pale blue or fancy pale blue/green in colour.

For all examples used in this specification absorption peak heights and integrated absorption values used to calculate the percentage of the absorption of the provided CVD diamond attributable to defects other than $N_s^0$ quoted in this specification are measured using a UV/visible absorption spectrum of the synthetic CVD diamond material taken at room temperature.

All room temperature absorption spectra mentioned herein were collected using a Perkin Elmer Lambda-19 spectrometer. The data recorded in the spectra ("the measured spectrum") were processed in the following way to give information on the proportion of the measured absorption in the range 350 to 750 nm that could be attributed to $N_s^0$ and the proportion of that measured absorption that can be attributed to other defects (the X defects).

a. A reflection loss spectrum was created using tabulated refractive index data and standard expressions for the reflection loss for a parallel-sided plate. The refractive index was determined according to Peter's equation [(1923) Z. Phys. 15, 358-368)] and subsequent reflection loss derived using the standard Fresnel equation.

b. The reflection loss spectrum was subtracted from the measured absorbance data and an absorption coefficient spectrum for the example is created from the resulting spectrum.

c. In order to determine the component of the measured spectrum that was attributable to $N_s^0$, an absorption spectrum for type Ib HPHT synthetic diamond (for which the absorption is attributed solely to $N_s^0$) was scaled until it is substantially removed the 270 nm peak from the measured spectrum when subtracted from it. This scaling allows the concentration of nitrogen to be determined.

d. Using the visible region of the spectrum as stretching from 350 nm (i.e. 3.2618 eV) to 750 nm (i.e. 1.6527 eV), the integrated absorption in the visible region was determined for the measured example spectrum and for the component of it attributable to $N_s^0$, and the percentage of the integrated absorption that is attributable to $N_s^0$ defects calculated.

e. In practice reflection losses are generally greater than the theoretical values and this makes it difficult without resorting to wavelength specific calorimetry methods to determine absolute absorption coefficient values. In order to correct for additional losses not directly related to absorption the following routine was used. Towards lower energies it was generally the case that below a particular energy the measured absorption no longer showed significant variation with energy. Absorption coefficient data were shifted so that absorption coefficient was zero at 800 nm According to different embodiments of methods according to the present invention, the provided CVD diamond may or may not contain $N_s^0$. Where it does contain $N_s^0$, the concentration of $[N_s^0]$ present in the synthetic CVD diamond material of the present invention may be measured using EPR for levels $<5\times10^{15}$ cm$^{-3}$ and using UV visible optical absorption techniques for higher concentrations.

$[N_s^0]$ in the neutral charge state content can be measured by using electron paramagnetic resonance (EPR). Whilst the method is well-known in the art, for completeness it is summarised here. In measurements conducted using EPR, the abundance of a particular paramagnetic defect (e.g. the neutral single-substitutional nitrogen defect) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimise the errors associated with double integration, base line correction, finite limits of integration, etc., especially in cases where overlapping EPR spectra are present, a spectral fitting method (using a Nelder-Mead simplex algorithm (J. A. Nelder and R. Mead, The Computer Journal, 7 (1965), 308)) is employed to determine the integrated intensity of the EPR centres present in the example of interest. This entails fitting the experimental spectra with simulated spectra of the defects present in the example and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsallis line shape in order to produce a good fit to the recorded EPR spectra (J. S. Hyde, M. Pasenkiewicz-Gierula, Jesmanowicz, W. E. Antholine, Appl. Magn. Reson., 1 (1990), 483). Using this method the concentration in ppm can be determined with a reproducibility of better than ±5%.

The technique of UV-visible absorption spectroscopy for measuring higher $[N_s^0]$ concentrations is well-known in the art, and involves measurements using the 270 nm peak of the absorption spectrum of the diamond material.

Nitrogen may also be present in the positive charge state ($N^+$), the concentration of $N^+$ is found by measuring the peak height of the feature at 1332 cm$^{-1}$ in the FTIR spectrum. SIMS techniques may also be used to obtain a total nitrogen concentration for the diamond material if the concentration is within the detection limit.

As noted above, a colour grade of G or better is advantageous for any brown provided diamond material, while a colour grade of T or better is acceptable for any yellow provided diamond material. Also as noted above, where small amounts of nitrogen are present in the source gas, and hence in the provided diamond material, then this is usually associated with the introduction also of so-called X-defects that introduce a brown colouration to the CVD diamond material. According to certain embodiments of the invention, where small amounts of nitrogen are present in the CVD diamond material special methods are carried out in order to result in a provided CVD diamond material in which any brown colouration (thought to be due to these X-defects) is avoided, or at least minimised. Where such brown colouration is minimised in this way, then $[N_s^0]$ concentrations may be up 1 ppm, since any yellow colouration resulting from the presence of the $N_s^0$ defects themselves will result in levels of $N_s^0$ that give a colour grade of T (yellow) or better. Practically for reasons of gas purity or diamond properties, or where it is desirable to achieve a more blue-green hue rather than a blue hue, it may be advantageous to have $[N_s^0]$ concentrations towards the upper limit of 1 ppm.

Especially where the provided CVD diamond material used in the method according to the present invention has a $[N_s^0]$ concentrations towards the upper limit of 1 ppm, then the absorption spectrum may have a total integrated absorption in the visible range from 350 nm to 750 nm such that less than 90% of the integrated absorption is attributable to defects other than $N_s^0$ defects. i.e. the so-called X-defects thought to be responsible for the brown colouration contribute less than 90% of the integrated absorption in the visible range.

It is also envisaged in this invention to use provided CVD diamond material with no, or only very small amounts of $[N_s^0]$ present. In these cases since there are only very small amounts of $[N_s^0]$ present, in general there will consequently be similarly very low or no X-defects and consequently little or no brown colouration (although under certain growth conditions this may not be case). This can be quantified by specifying that the absolute coefficients in the absorption spectrum 350 nm and 510 nm respectively are less than 0.5 cm$^{-1}$ and 0.3 cm$^{-1}$. So where there is little or no $[N_s^0]$ present, then any colouration of the diamond material is likely to be due to any small amounts of brown (rather than yellow which results from $N_s^0$ itself), and in this case the provided CVD diamond material has a colour grade G (brown) or better. Advantageously such a material may have the following characteristics in its absorption spectrum (when the absorption at 800 nm has been scaled to 0 cm$^{-1}$).

| Designation | Starts (nm) | Ends (nm) | Peak (nm) | Absorption coefficient at peak. (cm$^{-1}$) |
|---|---|---|---|---|
| 270 nm $N_s^0$ | 220 | 325 | 270 | <0.8 |
| 350 nm band Part of "X" | 270 | 450 | 350 ± 10 | <0.5 |
| 510 nm band Part of "X" | 420 | 640 | 510 ± 50 | <0.3 |

Methods of CVD diamond material growth are well established and have been described extensively in the patent and other literature, for example in WO 03/052177. These previously documented methods for growing CVD diamond material are believed to result in diamond material with an absorption spectrum with a total integrated absorption in the visible range from 350 nm to 750 nm such that the contribution of other defects to the visible part of the spectrum would be greater than 90%. Since these other defects are known to lead to the characteristic brown colouration of CVD diamond containing nitrogen, these known prior art CVD growth processes are not suitable for directly growing the provided CVD diamond material used in the method of the present invention.

One of the above-mentioned special methods that can be carried out in order to result in a provided CVD diamond material in which any brown colouration (thought to be due to the aforementioned X-defects) is avoided is by using a CVD growth process in which the source gas contains carbon, hydrogen, nitrogen and oxygen, rather than the more usual carbon hydrogen and nitrogen. For example, oxygen may be added to the process gas at a concentration of at least 10000 ppm in the gas phase. In particular, the provided CVD diamond material in step (i) of the method according to the first aspect of the invention may be grown directly by the process described in GB application GB0922449.4 and U.S. provisional application U.S. Ser. No. 61/289,282 the entire disclosures of which are incorporated herein by reference. Specifically the method involves providing a substrate; providing a source gas; and allowing homoepitaxial diamond synthesis on the substrate; wherein the synthesis environment comprises nitrogen at an atomic concentration of from about 0.4 ppm to about 50 ppm; and wherein the source gas comprises: (a) an atomic fraction of hydrogen $H_f$, from about 0.4 to about 0.75; (b) an atomic fraction of carbon, $C_f$, from about 0.15 to about 0.3; (c) an atomic fraction of oxygen, $O_f$, from about 0.13 to about 0.4; wherein $H_f+O_f+O_f=1$; wherein the ratio of atomic fraction of carbon to the atomic fraction of oxygen $C_f:O_f$, satisfies the ratio of about $0.45:1<C_f:O_f<$about $1.25:1$; wherein the source gas comprises hydrogen atoms added as hydrogen molecules, $H_2$, at an atomic fraction of the total number of hydrogen, oxygen and carbon atoms present of between 0.05 and 0.4; and wherein the atomic fractions $H_f, C_f$ and $O_f$ are fractions of the total number of hydrogen, oxygen and carbon atoms present in the source gas. This method of growing CVD diamond material shall be referred to in the specification as the "added oxygen CVD growth process".

Depending on the exact process parameters used (for example the growth substrate used, the pressure used, and the amount of nitrogen in the source gas), the above added oxygen CVD growth process may result directly in providing diamond material in which less than 90% of the integrated absorption in the visible range from 350 nm to 750 nm is attributable to defects other than $N_s^0$ defects (the X-defects), or not. In general the added oxygen CVD growth process allows a skilled worker to introduce higher percentages of nitrogen than would be possible with standard CVD processes, while reducing the number of X defects leading to the brown colouration. Thus, the present invention also envisages using the added oxygen CVD growth process to introduce such high concentrations of nitrogen that the number of other defects is also significant and the resultant grown diamond material has greater than 90% of the integrated absorption in the visible spectrum from 350 nm to 750 nm attributable to X defects. Such provided diamond material could then be treated by a subsequent high temperature anneal as described hereinafter to remove some or all of those defects. Tailoring the added oxygen CVD growth process so as to produce the desired diamond material defect concentration, and consequent absorption spectrum, will be a matter of simple experimentation for the person skilled in the art.

The CVD diamond material grown by the added oxygen CVD growth process may be used directly as the provided CVD diamond material in the method according to the invention. This route from CVD growth stage to formation of the provided diamond material is illustrated as "route A" in FIG. 1 of the accompanying drawings.

Instead of being used directly as the provided diamond material in the method according to the invention, the CVD diamond material grown by the added oxygen CVD growth process may be considered to be a added-oxygen-CVD-grown-precursor-diamond-material that is then subjected to a high temperature anneal at a temperature of at least 1600° C., or at least 1800° C., or at least 2000° C. in order to form the provided CVD diamond material. A CVD diamond material made by the added oxygen CVD growth process and then subjected to the high temperature annealing process may form the provided CVD diamond as used in methods according to the invention. This route to the provided CVD diamond material is illustrated as route B in FIG. 2. It is thought that this preliminary high temperature annealing process may reduce still further any X defects in the grown CVD diamond material, and that this may be advantageous for certain embodiments. The high temperature annealing step might be done on an as grown or processed stone.

Another possibility is for precursor CVD diamond material to be grown using a more conventional CVD process, for example of the type disclosed in WO 03/052177. Such a process, as noted above may result in diamond material with an absorption spectrum with a total integrated absorption in the visible range from 350 nm to 750 nm such that greater than 90% of the integrated absorption would be attributable to the undesirable brown colouring X-defects. We shall refer to this diamond material as the "traditional-CVD-grown precursor diamond material" in this specification, the word precursor being used to show it is a grown CVD diamond material that is different from and precedes the "provided CVD diamond material" defined by the method of the present invention. The word traditional is used to distinguish the route to the CVD grown precursor material from that described for route B above. We have found that if the traditional-CVD-grown precursor diamond material is subjected to the above mentioned high temperature annealing process it can result in diamond material in which less than 90% of the integrated absorption is attributable to defects other than $N_s^0$ defects (the brown-inducing X-defects). This route to the provided diamond material is shown in FIG. 1 as "route C".

It is also envisaged in the present invention to use as the provided diamond material a material containing very low $[N_s^0]$ concentrations, e.g. less than 0.1 ppm. These materials may be grown using a process with very low, or zero, nitrogen concentrations in the source gas. The resultant grown CVD diamond materials consequently contain no or minimal X defects, since these X defects are thought to result from structural and charge changes in the diamond material as a result of nitrogen in the diamond atomic structure; if the nitrogen is absent or minimal, then those structural changes do not take place or take place to a minimal extent. Therefore, certain embodiments of method according to the invention use a provided CVD diamond material having a $[N_s^0]$ concentration less than 0.1 ppm.

Methods of making CVD diamond material containing very low or zero $[N_s^0]$ concentrations are known in the art. For example, they are described in WO/019663A1, WO/019664A1, WO 2010/010352A1, and WO 2010/010344A1, the entire disclosures of which are incorporated herein by reference.

WO/019663A1, for example, describes a CVD diamond material particularly suitable for electronic applications, where the level of any single impurity is not greater than 5 ppm and the total impurity content is not greater than 10 ppm. Preferably the level of any impurity is not greater than 0.5 to 1 ppm and the total impurity content is not greater 2 to 5 ppm (where "impurity" excludes hydrogen and its isotopic forms). In the method described in WO/019663A1 the impurity content of the environment in which the CVD growth takes place is controlled such that growth is in the presence of an atmosphere containing substantially no nitrogen, i.e. less than 300 ppb, has a molecular fraction of the total gas volume, and preferably less than 100 ppb, and the substrate onto which it is grown is substantially defect free.

WO2010/010352 A1, for example, describes a method of making high chemical purity and high isotropic purity diamond material suitable for use in spintronic applications. In particular, the method of CVD growth comprises providing a diamond substrate having a surface which a substantially free of crystal defects, and providing a source gas mixture comprising high purity gases where the concentration of nitrogen is about 300 ppb or less, and solid carbon source comprising $^{12}C$ in an amount of at least 99% of the total carbon content of the source and activating and/or disassociating at least a portion of the source gas and the solid carbon source to form gaseous carbon species and allowing homoepitaxial diamond growth on the surface of the substrate.

CVD diamond material made by processes described above. e.g. of the type described in WO/019663A1, WO/019664A1, WO 2010/010352A1, and WO 2010/010344A1, which use substantially no nitrogen will be referred to hereinafter as "high purity CVD diamond material growth processes". These processes are suitable for forming the provided CVD diamond material used in methods according to the invention. Since the high purity provided CVD diamond material so formed contains substantially no nitrogen, and consequently substantially no X-defects, the provided CVD diamond material made by these high purity methods will be colourless, near colourless or pale brown.

The colour of the irradiated diamond material is a combination of the starting colour, if any, of the provided diamond material and the colour introduced by the irradiation step introducing isolated vacancies. Other impurities that could introduce colour into the provided diamond material may in certain embodiments be minimised. For example, uncompensated boron (isolated boron) may itself introduce a blue colour to the diamond material. For some embodiments the boron concentration [B] in the provided diamond material is less than $5\times10^{15}$ cm$^{-3}$.

It is known that if there is uncompensated boron in diamond material this may be compensated for by irradiating to introduce isolated vacancies, the isolated vacancies combining with the boron so that neither the boron, nor those compensating isolated vacancies impart any colour to the diamond material. Therefore in some embodiments according to the present invention, if the diamond material does contain uncompensated boron (for example in a concentration of $>5\times10^{15}$ cm$^{-2}$), then the irradiation step may be carried out so as to introduce sufficient isolated vacancies not only to combine with the boron but also to achieve the specified isolated vacancy concentration $[V_T]$. The level of additional irradiation needed for boron-compensation can be determined empirically by the person skilled in the art.

By adding more nitrogen to the provided diamond material using methods in which brown inducing X-defects are not simultaneously introduced (e.g. the aforementioned oxygen process), or by eliminating those defects (e.g. by a high temperature annealing step) then more yellow can be introduced into the provided CVD diamond material, and hence a blue/green diamond material results after the irradiation step. This is thought to be because the presence of the $N_s^0$ in the material results in a charge transfer of $V^0$ to $V^-$. For example, where there is relatively low $[N_s^0]$ concentrations, most of the vacancies present in the provided diamond material are neutral vacancies $V^0$ which tend to impart a blue colour. When there is relatively higher $[N_s^0]$ concentrations more negative vacancies $V^-$ are present in the provided diamond material, and these tend to impart a blue/green colour. Thus the invention proved a convenient means of tailoring the irradiated diamond material through all shades of pale blue to pale blue/green by simple modification of the $[N_s^0]$ concentration. Advantageously controlling the ratio of $V^-/V^0$ by starting with different concentrations of nitrogen in the provided diamond material means that the hue angle can be varied to achieve the desired colour (between blue and green). Some embodiments of the invention comprise selecting the $[N_s^0]$ concentration of the provided diamond material so as to provide a target $V^-/V^0$ ratio in the provided diamond material. In addition to the blue to blue/green colour difference imparted by the different $V^-/V^0$ ratio, there may also be a residual yellow hue from any remaining nitrogen, which would also tend to result in a greener blue/green diamond material post treatment.

Another aspect of the present invention provides a system for being able to select and make a desired colour of diamond material within the fancy blue to blue/green colour range, having a hue angle within the range 100°-270°; the system comprising the steps of:

(a) predetermining a target $[N_s^0]$ concentration for a grown CVD diamond material, that after irradiation of that grown CVD diamond material will result in the said desired colour;

(b) growing diamond material by a CVD process that includes introducing sufficient nitrogen in a process gas in the CVD process so as to achieve the said target $[N_s^0]$ concentration in the grown CVD diamond material, which CVD diamond material has the properties of the provided diamond material set out in step (i) of method claim 1; then (c) carrying out the irradiation step set out in step (ii) of method claim 1 on the grown CVD diamond material.

The provided CVD diamond material used in the method according to the first aspect of the present invention preferably may have at least about 50%, alternatively at least about 80%, alternatively at least about 90%, alternatively at least about 95% of the volume of the synthetic CVD diamond material formed from a single growth sector. This single growth sector is preferably a {100} or a {110} growth sector. The material of the single growth sector preferably has $N_s^0$ levels within ±10% of the mean for greater than about 50% of the volume of the growth sector, alternatively greater than about 60% of the volume of the growth sector, alternatively greater than about 80% of the volume of the growth sector. Using a provided synthetic CVD diamond material that has been grown from a single growth sector is advantageous as the CVD diamond material will have fewer surfaces with different crystallographic orientation (which are the surfaces corresponding to differing growth sectors). Surfaces with different crystallographic orientations exhibit strongly differential uptake of nitrogen impurity and a synthetic CVD diamond material comprising more growth sectors therefore tends to show more undesirable zones with different colour, resulting from the different concentrations of $N_s^0$ in different growth sectors.

Where methods according to the invention comprise a preliminary process of growing the provided CVD diamond, these methods preferably comprise growing the diamond material to have the above stated percentages formed from a single growth sector.

Another advantage of having provided CVD diamond from predominantly a single growth sector is that in different growth sectors there may be different quantities, distributions and types of defects Using CVD synthetic diamond material rather than natural diamond or HPHT synthetic diamond material to produce pale blue diamond is advantageous for a number of reasons. For example, natural diamond is variable in its properties; therefore making it more difficult to find matching diamonds to be set together for ornamental use. An advantage of CVD diamond material over natural diamond material is that the synthetic CVD process and the post growth treatment can be tailored to achieve the exact hue and saturation of colour desired rather than having to accept what is available As another example, diamond material produced using HPHT synthesis techniques exhibits strongly differential uptake of nitrogen impurity on the surfaces with different crystallographic orientation (which are the surfaces corresponding to differing growth sectors) that form during synthesis. HPHT does not normally have a single dominant growth sector, unlike that typically achieved in CVD. The diamond material therefore tends to show zones with different colours, resulting from the differing nitrogen impurity concentrations in different growth sectors. In addition, it is hard to control the HPHT diamond material synthesis process sufficiently to give a uniform and desired nitrogen concentration throughout even a single growth sector within the synthesized diamond material. Furthermore, in HPHT diamond material synthesis, it is typical to see impurities resulting from the synthesis process and the catalysts used—examples would be inclusions comprising cobalt or nickel—features that can result in localised and inhomogeneous strain that degrade the optical and thermal properties. In contrast, CVD diamond material is much more uniform in colour than either natural or HPHT synthetic diamond material, and will not have any issues with metallic inclusions.

A synthetic CVD diamond material may be unequivocally distinguished from a synthetic diamond material synthesized using HPHT techniques by the dislocation structure. In synthetic CVD diamond, dislocations generally thread in a direction that is roughly perpendicular to the initial growth surface of the substrate, i.e. where the substrate is a (001) substrate, the dislocations are approximately aligned parallel to the [001] direction. In synthetic diamond material synthesized using HPHT techniques, dislocations that nucleate on surface of the seed crystal (often a surface close to {001}) typically grow in <110> directions. Thus the two types of material can be distinguished by their different dislocation structures observed, for example, in an X-ray topograph. This also provides a route to distinguish CVD from natural type IIa, as natural diamond does not show these clear parallel disoclations.

However, obtaining X-ray topographs is an onerous task and clearly an alternative, less onerous method that enables positive distinction would be desirable.

A synthetic CVD diamond material may be positively distinguished from a synthetic diamond material synthesized using HPHT techniques by the presence of metallic inclusions in the HPHT-synthesized material that are incorporated as a result of the synthesis process. The inclusions are comprised of the metals used as the solvent catalyst metal, e.g. Fe, Co, Ni etc. Inclusions can vary in size from less than 1 μm to more than 100 μm. Larger inclusions can be observed using a stereo-microscope (e.g. a Zeiss DV4); whilst smaller inclusion can be observed using transmitted light in a metallurgical microscope (e.g. a Zeiss "Axiophot").

A further method that can be used to provide positive distinction between synthetic diamonds produced by CVD and HPHT methods is photoluminescence spectroscopy (PL). In the case of HPHT-synthesised material, defects containing atoms from the catalyst metals (typically transition metals) used in the synthesis process (e.g. Ni, Co, Fe etc.) are frequently present and the detection of such defects by PL positively indicates that the material has been synthesised by an HPHT method.

Embodiments of method according to the invention comprise irradiating the diamond material with electrons. The step of irradiation acts to introduce isolated vacancies V into the diamond, as discussed hereinbefore.

We have found that irradiating the diamond material with radiation other than electron radiation does not result in a fancy pale blue or fancy pale blue/green coloured diamond. In particular we have found that irradiation with neutrons produces a yellow green coloured diamond.

In general the greater the irradiation dose, the greater the number of isolated vacancies created. The level of the irradiation dose and any post irradiation treatment is selected so that $[V_T] \times L$ is at least 0.072 ppm cm and at most 0.36 ppm cm. Typically for a 0.5 ct rbc this corresponds to a concentration range for $[V_T]$ of 0.12-0.6 ppm.

In some embodiments according to the invention the dose of electrons is selected so as to introduce $[V_T] \times L$ in the irradiated diamond material of at least 0.072 ppm cm and at most 0.36 ppm cm. In these cases there is preferably no further post-irradiation treatment applied to the diamond material that could significantly affect the isolated vacancy concentration in the diamond material It is possible for the diamond material to be irradiated so as to introduce more than the final desired concentration of isolated vacancies. In these cases it is possible to subsequently decrease the concentration of isolated vacancies by a post irradiation treatment step. We have found that it is possible to decrease the concentration of isolated vacancies by up to about 50% by such a post irradiation step. The post irradiation step may comprise annealing the sample, for example at a temperature of at least 300° C., or at a temperature of at most 600° C. The period of the anneal may be short, for example, simply ramping up the temperature from room temperature to the anneal temperature, and then allowing the sample to cool down again, or the sample may be held at the anneal temperature for a period, of a few or several hours, for example 2 hours. Without limiting the invention in any way, we believe that annealing at this temperature may cause any interstitials present in the material to become mobile and therefore diffuse and recombine with some of the isolated vacancies and consequently reduce the concentration of the isolated vacancies. This over-irradiation (to produce surplus isolated vacancies) followed by an anneal to remove those surplus isolated vacancies disadvantageously involves an extra step, but it may be used in certain circumstances, and provided the resultant post treatment isolated vacancy concentration is within the prescribed limits falls within the scope of the present invention.

Therefore other embodiments of method according to the invention comprise an additional step of post-irradiation treating the irradiated diamond material so as to achieve $[V_T] \times L$ in the irradiated diamond material of at least 0.072 ppm cm and at most 0.36 ppm cm. This post-irradiation treatment step may comprise annealing the irradiated diamond material at a temperature of at least 300° C. and at most 600° C. In these embodiments since a post irradiation anneal may decrease the concentration of isolated vacancies by up to 50%, then the initial dose of electrons may be selected so as to introduce $[V_T] \times L$ in the irradiated diamond material of at most 0.72 ppm cm An additional benefit of irradiating the CVD diamond material is that typically the colour of the material will be more stable to low temperature annealing and exposure to UV light compared to untreated CVD diamond. This stabilisation effect is discussed in GB0911075.0, and US61/220,663 both filed 26 Jun. 2009, and in GB0917219.8 and US61/247,735 both filed 1 Oct. 2009, the entire disclosures of which are incorporated herein by reference. Thus an advantage of the present invention is that it results in a blue or blue green diamond material which, in the absence of the irradiation step of the method of the present invention would show a measurable difference in at least one of its absorption characteristics in first and second states, the first state being after exposure to irradiation having an energy of at least 5.5 eV and the second state being after thermal treatment at 798K (525° C.), but which following the method of the present invention results in diamond material that shows little or no colour change when in the said first and second states, given that the concentration of interstitials has been minimised. Advantageously, in some embodiments, post irradiation the change in colour saturation value C* between the first and second states is reduced by at least 0.5 compared with the diamond material that has not been subjected to irradiation. In some embodiments the change in C*, post irradiation, of the diamond material in the first and second states is <1. In some embodiments the irradiated diamond material, or the irradiated diamond material after a further post-irradiation treatment, may have an absorption coefficient measured at 77 K of at least 0.01 cm$^{-1}$ at a wavelength of 741 nm; or an absorption coefficient measured at 77 K of at least 0.01 cm$^{-1}$ at a wavelength of 394 nm.

It is known that the energy of the irradiation determines the penetration of the irradiation. As a rough approximation every additional MeV of energy of an electron beam will penetrate an additional 0.7 mm of diamond. Typical electron irradiation sources are available at 1.5 and 4.5 MeV, and we have found that it is preferable to use a 4.5 MeV electron source for irradiation to achieve the desired penetration for typical sized diamonds; e.g. for a 0.5 carat diamond having a thickness of about 3 mm. Typically the electron beam source may have a 50% scan width and a 20 mA current for example at the facility used at Isotron plc.

Electron irradiation is typically carried out with a beam source in the energy range 0.8 MeV to 12 MeV. Optionally the energy that is used is that which introduces a near uniform concentration of isolated vacancies in the N doped diamond material, while minimizing the formation of cascade damage e.g. vacancy chains. For the optimum results reported here it was found that 4.5 MeV provided a good compromise between these two factors.

Optionally, and particularly for larger samples, rotation of the sample during irradiation, or repeated rotation followed by irradiation, may be used to assist in achieving uniformity of the created isolated vacancies throughout the volume of the stone.

Factors such as diamond temperature, beam energy, beam flux, and even the starting diamond's properties can affect the [V$_T$] produced for a fixed experimental irradiation set-up and time. Irradiation is typically carried out with the sample mounted under ambient conditions ~300K with only minimal temperature rise during the irradiation dose (e.g. less than 100K). However, factors such as beam energy and beam flux can lead to sample heating. Preferably the sample is held as cold as possible (with even cryogenic cooling at 77K being advantageous under some circumstances) to enable high dose rates without compromising temperature control and thus minimize the irradiation time. This is advantageous for commercial reasons. Calibration of the dose applied against the isolated vacancies produced for the particular provided diamond being used in order to satisfy these limits on [V$_T$] concentration introduced will form part of the skilled person's responsibilities before carrying out the method of the present invention. Such calibration techniques are routine for the person skilled in the art.

We have also found that the period of irradiation affects the number of isolated vacancies that are incorporated into the diamond material and the isolated vacancy incorporation rate is different for different starting materials and starting temperatures.

A typical irradiation dose for a 0.5 ct rbc diamond stone, when the sample temperature is ~350 K, is 1×10$^{17}$-1×10$^{18}$e$^-$ cm$^{-2}$.

A typical irradiation time for a 0.5 ct rbc diamond stone, when the sample temperature is ~350 K, is 5-30 minutes at 4.5 MeV, 20 mA and 50% scan width using an instrument such as that found at Isotron plc.

Throughout this specification to measure concentrations of isolated vacancies, spectra are obtained at 77K, using liquid nitrogen to cool the samples, since at that temperature sharp peaks at 741 and 394 nm are seen that are attributable to neutral and negatively charged isolated vacancies respectively. The coefficients that are used for the calculations of concentrations of isolated vacancies in the present specification are those set out by G. Davies in Physica B 273-274 (1999) 15-23, as detailed in Table 1 below.

TABLE 1

| Defect | Calibration |
| --- | --- |
| V$^-$ | $A_{ND1} = (4.8 \pm 0.2) \times 10^{-16}[V^-]$ |
| V$^0$ | $A_{GR1} = (1.2 \pm 0.3) \times 10^{-16}[V^0]$ |

In Table 1, "A" is the integrated absorption (meV cm$^{-1}$) in the zero phonon line of the transition, measured at 77 K, with the absorption coefficient in cm$^{-1}$ and the photon energy in meV. The concentration is in cm$^{-3}$.

According to methods of our invention [V$_T$]×L after irradiation, or after a further post-irradiation treatment, is at least 0.072 ppm cm, and at most 0.36 ppm cm.

The provided CVD diamond material used in the method according to the present invention, and also the irradiated CVD diamond material resulting from the method of the present invention may, or may not, form part of a larger piece of diamond material. For example part only of the larger piece of diamond material may be irradiated and turned blue, and/or part only of the larger piece of diamond material may have the defined absorption characteristics. As would be apparent to the person skilled in the art multiple layers could also be irradiated and/or have the required absorption characteristics, so that the provided CVD diamond material used in the method according to the invention may form part, e.g. one or multiple layers of a larger piece of diamond material. It is well known that the depth of penetration of irradiation is dependent on the energy of the irradiation. So in preferred embodiments an irradiation energy is selected such that the irradiation penetrates only part of the depth of a CVD diamond material. This means that isolated vacancies would be introduced only in the penetrated part of the irradiated CVD diamond material, and hence that penetrated part of the CVD diamond material would be the "diamond material" used formed by the method of the present invention.

Where the provided CVD diamond material provides only part of a larger piece of diamond material, as discussed above that provided CVD diamond material alone may have the advantageous optical properties described for certain embodiments of the invention. Thus for example a top or embedded layer or layers of a large piece of CVD diamond material may have a pale blue or pale blue/green colouration. Where any other non-pale-blue, or blue/green layers are substantially colourless the colour of the larger piece of diamond material is dominated by the pale blue or pale blue/green layer(s).

In some embodiments according to the invention at least 50% or at least 60% or at least 70% or at least 80% or at least 90% or substantially the whole diamond stone may have substantially the same colour.

In other embodiments according to the invention of diamond stone may comprise layers or pockets of diamond material of the same colour It is an advantage of the present invention that by starting with a CVD diamond material with a specific nitrogen concentration, that is substantially colourless or pale-coloured, and irradiating the CVD diamond material with electrons, pale blue or pale blue/green diamond material can be produced. The precise colour (between blue and green) can be altered by controlling the nitrogen concentration. Advantageously, low levels of everything else, e.g. other elements that might introduce other colour are maintained. The irradiation is controlled to introduce a particular concentration of isolated vacancies in the diamond material, thereby introducing a fancy pale blue or fancy pale blue/green colour. These coloured diamond materials may find particular application as gemstones, or as coloured filters or as a cutting tool for example a scalpel and the like. It should be noted that the terms "colourless" and "white" are sometimes used synonymously in the field to describe the colour of diamond materials for gemstones.

The present invention also provides diamond material whenever made by a method according to the first aspect of the invention.

A fancy pale blue or pale blue/green CVD diamond material in which the colour does not come solely, or at all, from boron is also new per se. Therefore a second aspect of the present invention provides a fancy pale blue, or fancy pale blue/green CVD synthetic single crystal diamond material having either $[B]<1\times10^{15}$ cm$^{-3}$ or $[N]-[B]<1$ ppm and the following colour characteristics:

| Characteristic | Range |
| --- | --- |
| Hue angle α | 100-270 |
| | optionally 110-230 |
| | optionally 120-200 |
| Saturation - C* | At least 2 and at most 10 |
| | optionally 2-8 |
| | optionally 2-6 |
| Lightness - L* | >65 |
| | optionally >70 |
| | optionally >72 |

The colour of the irradiated and annealed diamond can be quantified in a well established manner using "CIE L*a*b* Chromaticity Coordinates". The use of CIE L*a*b* Chromaticity Coordinates in diamond is described in WO 2004/022821, the entire disclosure of which is incorporated herein by reference. This method is particularly useful for assessing the colour of plates or blocks of diamond material. The colour of a round brilliant polished diamond can either be assessed by eye by a trained person or using the CIE L*a*b* Chromaticity Coordinates if a flat is polished on to the culet so that there are two parallel polished sides to take a measurement through. a* and b* are plotted as x and y axes of a graph and the hue angle is measured from the positive a* axis towards the positive b* axis. Thus a hue angle of greater than 90° and less than 180° lies in the upper left quadrant of the a*b* graph. In this scheme for describing colour L* is the lightness and a fourth coordinate C* is the saturation.

The perceived colour of an object depends on the transmittance/absorbance spectrum of the object, the spectral power distribution of the illumination source and the response curves of the observer's eyes. The CIE L*a*b* chromaticity coordinates (and therefore hue angles) quoted herein have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength λ,
$L_\lambda$=spectral power distribution of the illumination
$x_\lambda$=red response function of the eye
$y_\lambda$=green response function of the eye
$z_\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0=\Sigma_\lambda y_\lambda L_\lambda$ $$L^*=116\,(Y/Y_0)^{1/3}-16=\text{Lightness (for } Y/Y_0>0.008856)$$

$$a^*=500[(X/X_0)^{1/3}-(Y/Y_0)^{1/3}]\text{ (for } X/X_0>0.008856, Y/Y_0>0.008856)$$

$$b^*=200[(Y/Y_0)^{1/3}-(Z/Z_0)^{1/3}]\text{ (for } Z/Z_0>0.008856)$$

$$C^*=(a^{*2}+b^{*2})^{1/2}=\text{saturation}$$

$$h_{ab}=\arctan(b^*/a^*)=\text{hue angle}$$

Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is standard to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIE L*a*b* coordinates for the new thickness. In this way the dependence of the hue, saturation and lightness on optical path length can be modelled to give an understanding of how the colour of diamond with given absorption properties per unit thickness will depend on the optical path length.

L*, the lightness, forms the third dimension of the CIE L*a*b* colour space. It is important to understand the way in which the lightness and saturation vary as the optical path length is changed for diamond with particular optical absorption properties. The method described in the preceding paragraph can also be used to predict how the L*C* coordinates of diamond with a given absorption coefficient spectrum depend on the optical path length.

The C* (saturation) numbers can be divided into saturation ranges of 10 C* units and assigned descriptive terms as below.

| | |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

Similarly the L* numbers can be divided up into lightness ranges as follows:

| | |
|---|---|
| 5-15 | very very dark |
| 15-25 | very dark |
| 25-35 | dark |
| 35-45 | medium/dark |
| 45-55 | medium |
| 55-65 | light/medium |
| 65-75 | light |
| 75-85 | very light |
| 85-95 | very very light |

There are four basic colour tones defined by the following combinations of lightness and saturation:

| | |
|---|---|
| Bright: Light and high saturation, | Pale: Light and low saturation, |
| Deep: High saturation and dark, | Dull: Low saturation and dark. |

An embodiment of the present invention comprises a fancy pale blue or fancy pale blue/green synthetic single crystal diamond material having dislocations extending in a direction within 10° of the growth direction of the diamond material, having a boron concentration [B] of <$5 \times 10^{15}$ atoms/cm$^3$ and the following colour characteristics:

| Characteristic | Range |
|---|---|
| Hue angle α | 100-270 |
| Saturation C* | At least 2 and at most 10 |
| Lightness L* | >65 |

An embodiment of the invention comprises diamond material according to the invention and a setting for the diamond material.

An embodiment of the invention comprises a round brilliant cut diamond gemstone comprising diamond material according to the invention.

Figure 2:
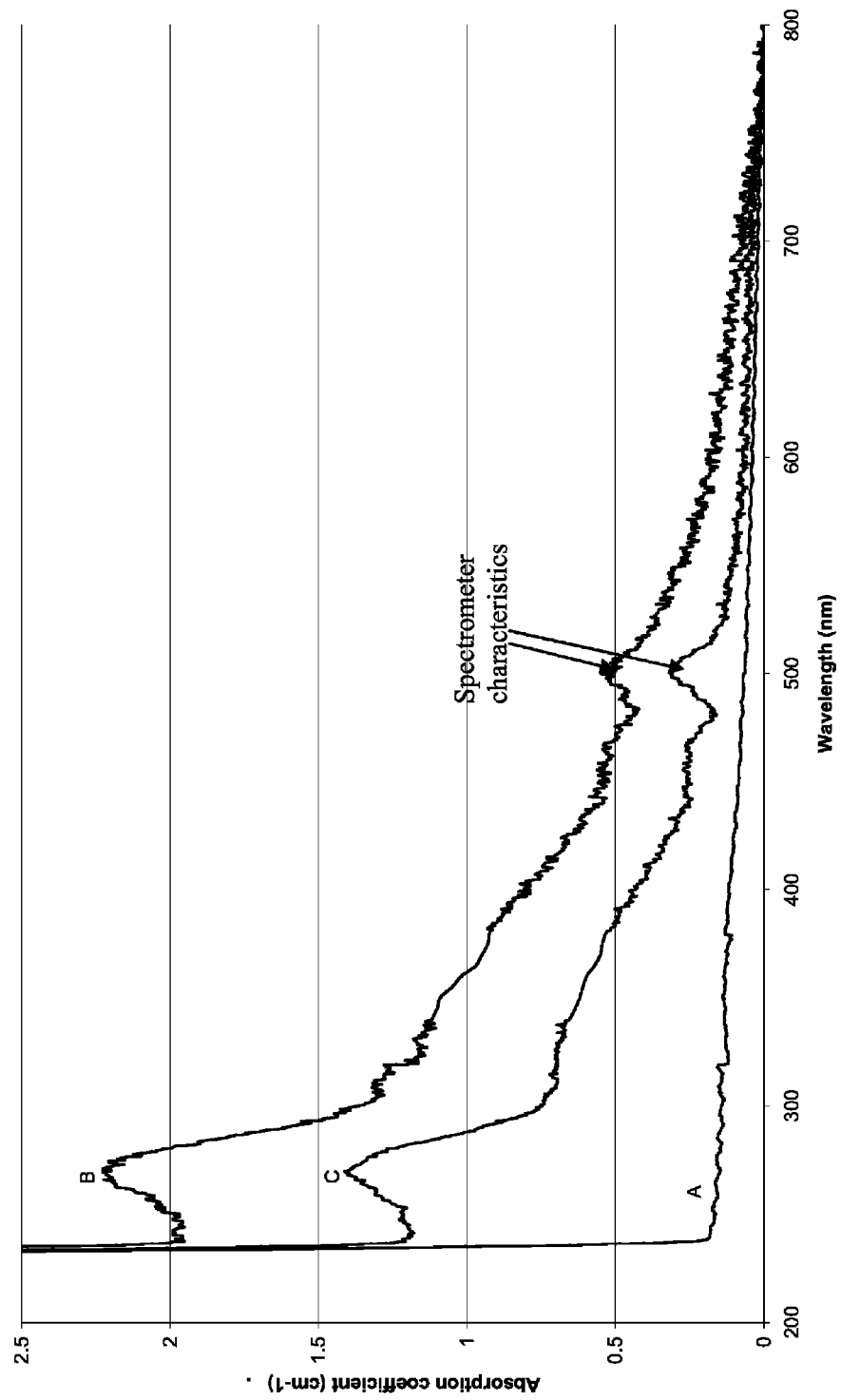
Figure 3:
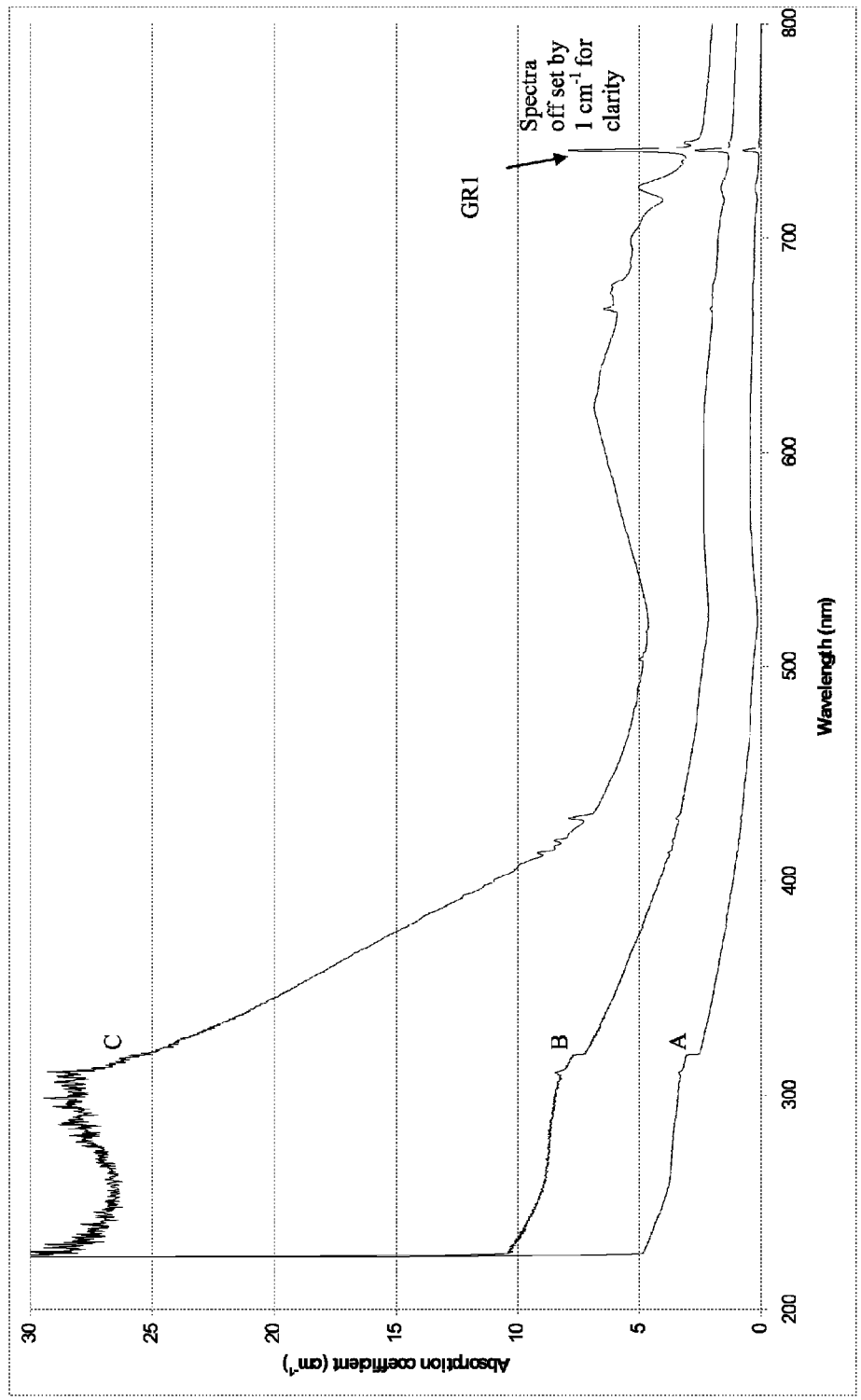
Figure 4:
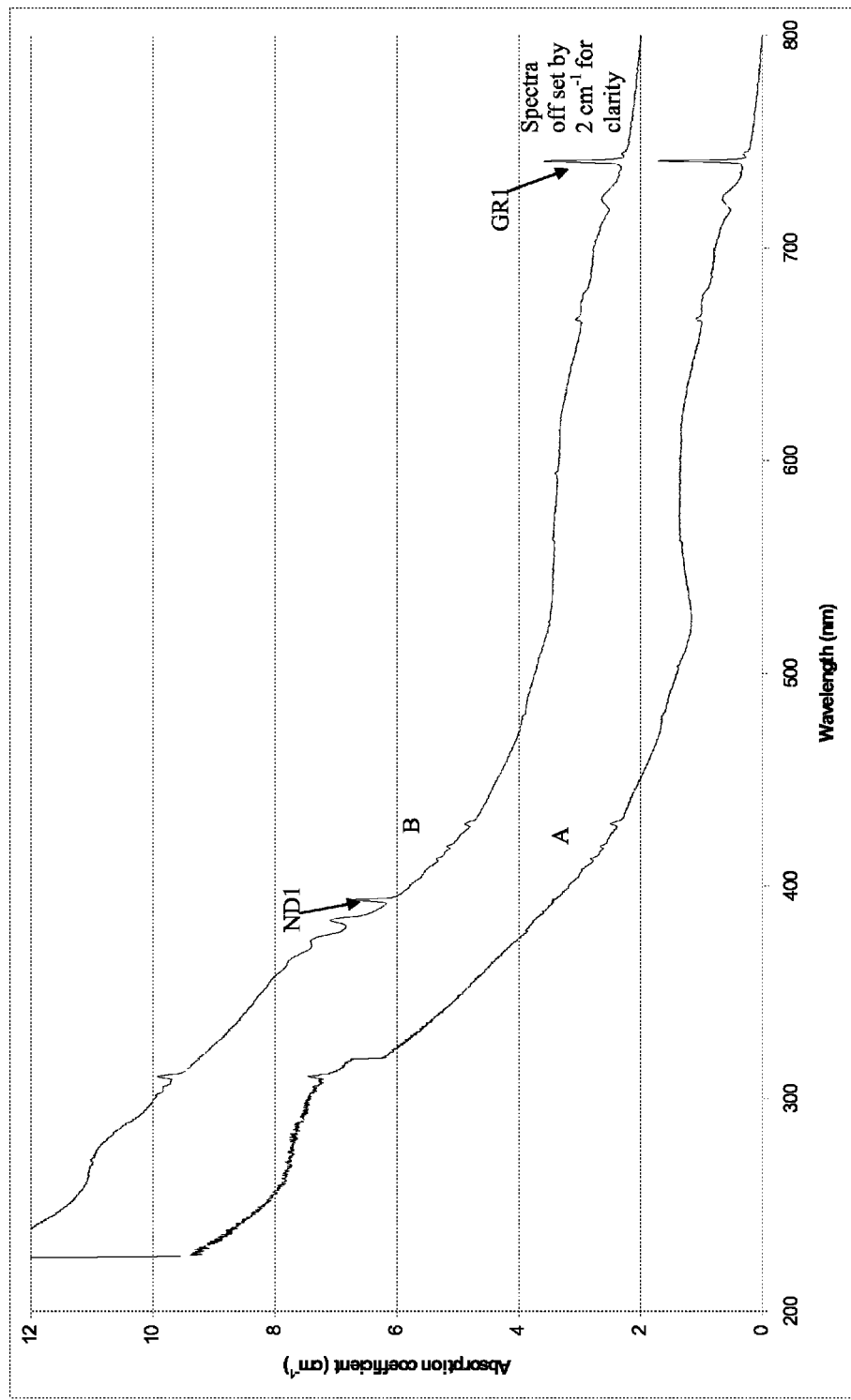

Embodiments of the invention will now be described, by way of example, with reference to the accompanying drawings and examples, wherein:

FIG. 1, which has been referred to hereinbefore, is a flow chart which shows routes for methods according to the invention for obtaining pale blue or pale blue/green diamond material;

FIG. 2 are absorption spectra A, B and C measured at room temperature, where A is the spectrum for the starting diamond material used in examples 2-4 and 9, B is the spectrum for the starting material used in example 1 and 8, and C is the spectrum for the starting material used in examples 5-7;

FIG. 3 are UV Visible absorption spectra A, B and C measured at 77 K, where A, B and C are respectively the absorption spectra for examples 2, 3 and 4 each shown after irradiation as specified; and FIG. 4 are absorption spectra A and B measured at 77 K for examples 2 and 6 respectively post irradiation, showing the ND1 and GR1 peaks, which are indicative of V$^-$ and V$^0$ defects respectively.

EXAMPLES

HPHT diamond substrates suitable for synthesising single crystal CVD diamond of the invention were laser sawn, lapped into substrates, polished to minimise subsurface defects such that the density of defects is below $5 \times 10^3$/mm$^2$, and generally is below 10$^2$/mm. Polished HPHT plates 3.6 mm×3.6 mm square by 500 μm thick, with all faces {100} having a surface roughness $R_Q$ at this stage of less than 1 nm were mounted on a refractory metal disk, and introduced into a CVD diamond growing reactor.

Growth Stages

1) The CVD diamond reactor was pre-fitted with point of use purifiers, reducing unintentional contaminant species in the incoming gas stream to below 80 ppb.
2) An in situ oxygen plasma etch was performed using 50/40/3000 sccm (standard cubic centimeter per second) of $O_2$/Ar/$H_2$ and a substrate temperature of 760° C.
3) This moved without interruption into a hydrogen etch with the removal of the $O_2$ from the gas flow.
4) This moved into the growth process by the addition of the carbon source (in this case $CH_4$) and dopant gases. For these examples the $CH_4$ flowing at 165 sccm, nitrogen was present in the process gas at different levels for the different examples, provided from a calibrated source for example a source containing 100 ppb $N_2$ either as air in Ar or $N_2$ in $H_2$ and for some examples $O_2$ was also present in the process gas.
5)

| Example | Nitrogen dopant present in the process gas (ppm) | Oxygen ($O_2$) flow present in the process gas (ppm) |
|---|---|---|
| 1 and 8 | 1.8 | 0 |
| 2-4 and 9 | 0.09 | 0 |
| 5-7 | 1.0 | 13700 |

6) On completion of the growth period, the substrate was removed from the reactor and the CVD diamond layer removed from the substrate by laser sawing and mechanical polishing techniques.
7) This produced a CVD sample which had typical dimensions ~3.1×5×5 mm and a typical average path length for light of 6 mm.

This grown CVD diamond is the CVD diamond material that is irradiated according to methods of the invention FIG. 2 are absorption spectra A, B and C, where spectrum A is that of the starting diamond material used in examples 2-4 and 9, and represents diamond material grown by a high purity CVD growth process. In these examples the percentage of the integrated absorption in the visible spectrum of the provided CVD diamond attributable to defects other than $N_s^0$ is >90%. In these examples, this is because the absolute [$N_s^0$] concentration is low, as is shown by the fact that there is no distinct peak at 270 nm. The material does not have a brown colouration as the absorption at 510 and 350 nm are <0.5 and 0.3 cm$^{-1}$ respectively These high purity materials are colourless and are a suitable provided CVD diamond material for irradiation according to the method of the invention. In FIG. 2, spectrum B is that of the starting material used in examples 1 and 8. This starting material is a CVD diamond material grown by a traditional CVD growth process with no oxygen in the source gas. In these examples the percentage of the integrated absorption in the visible spectrum of the starting CVD diamond material attributable to defects other than $N_s^0$ is >90%, and furthermore the absorption at 510 and 350 nm are >0.5 and 0.3 cm$^{-1}$ respectively. The starting diamond materials of examples 1 and 8 are, therefore not untreated suitable starting materials for the irradiation method of the present invention and are pale brown prior to irradiation. However if treated, e.g. HPHT annealed prior to irradiation as shown in example 8 they are suitable precursor diamond materials for the irradiation method of the present invention. In FIG. 2, spectrum C is that of the starting material used in examples 5-7 which are diamond materials grown by a CVD growth process with added oxygen in the source gas. In this spectrum, the absorption at 510 and 350 nm are >0.5 and 0.3 cm$^{-1}$ respectively, however the percentage of the integrated absorption in the visible spectrum of the provided CVD diamond attributable to defects other than $N_S^0$ is now <90%. These examples are suitable starting material for irradiation according to the method of the present invention, and are pale yellow prior to irradiation.

The electron irradiation of all samples was carried out with a 4.5 MeV electron beam on 50% scan width and 20 mA beam current). Diamond samples to be irradiated are mounted in indium on a water cooled copper block to prevent the samples being heated above 350K.

Table 3 shows the CVD growth process (or route to the provided CVD diamond material as indicated in FIG. 1, where applicable), the $N_s^0$ concentrations in ppm, the percentage of the total integrated absorption attributable to $N_s^0$ defects for the diamond material samples provided as above, the absorption coefficients at 270 nm, 350 nm and 510 nm, the irradiation dose, the total isolated vacancy concentration (and breakdown to neutral and negative isolated vacancy concentrations), and the colour before and after irradiation.

Table 3 includes a number of comparative examples. Considering each of the examples in table 3 in turn, example 1 (which is a comparative example) shows traditionally grown CVD diamond material in which the percentage of integrated absorption in the provided diamond attributable to defects other than $N_s^0$ is 91.6%, and its absorption coefficients at 350 nm is 1.19 cm$^{-1}$ and at 510 nm is 0.45 cm$^{-1}$; its colour pre-irradiation is pale brown, in other words the provided CVD diamond material falls outside the criteria set out in method step (i). After irradiation the observed colour of the diamond material is dull brownish-blue, not the desired fancy pale blue or fancy pale blue/green of the present invention. Also the colour characteristics of example number 1 fall outside those specified by the main article claim of the present invention. Example 1 could be HPHT annealed as shown in example 8 to make it suitable to make a pale blue/blue-green material, but untreated is not suitable.

Example 2, 4, 5 and 7 (again comparative examples), uses diamond material falling within the scope of the method claim of the present invention, but introduce a product of total isolated vacancy concentration×path length that are either lower than required minimum of at least 0.072 ppm cm (examples 2 and 5) or higher than the maximum (examples 4 and 7) 0.36 ppm cm. The colour of these examples after irradiation are not the desired fancy pale blue and fancy pale blue/green, and the colour characteristics fall outside those defined by the main article claims.

FIG. 3 shows UV Visible spectra A, B and C taken at 77 K post irradiation where spectrum A is that of example 2 and indicates (by the height of the GR1 peak) an isolated vacancy concentration that is too low to impart the desired fancy pale blue/blue-green colour desired for the present invention; spectrum B is that of example 3 and indicates an isolated vacancy concentration that is within the scope of the claim, and will impart the desired fancy pale blue/blue-green colour desired for the present invention, and spectrum C is that of example 4 and indicates an isolated vacancy concentration that is too high to impart the desired fancy pale blue/blue-green colour desired for the present invention Another indictor of the isolated vacancy concentrations post irradiation of these samples is shown in Table 3 which includes columns indicating the $V^0$ and $V^-$ concentrations post irradiation in ppm, this data having been calculated by integrating the area under the GR1 and ND1 peaks respectively.

Example 9 (again a comparative example) uses neutron irradiation rather than electronic radiation. This results in a vivid yellow diamond material after irradiation, the C* and L* values are outside the limits of the claims of this patent.

Comparison of the examples also shows how it is possible to modify the hue angle (and hence the precise perceived colour) within the claimed range by altering the concentration of $N_S^0$ in the provided diamond. Examples 3 and 6 both produce pale blue/pale blue green, but the exact hue angle has been modified by introducing different concentrations of $N_s^0$.

FIG. 4 which are absorption spectra taking post irradiation for examples 3 and 6, shows the different ratio of $V^0$ and $V^-$ defects formed following the same irradiation for starting materials containing different concentrations of $N_S^0$. Spectrum A which is that of example 3, which contains low [$N_S^0$] concentration shows virtually no ND1 peak at 394 nm (indicating that the sample contains virtually no $V^-$ defects). In contrast spectrum B which is that of example 6 which contains higher [$N_S^0$] concentration shows an increased height of ND1 peak at 394 nm (indicating increased presence of $V^-$ defects). Both spectra A and B show comparable GR1 peaks, and so the ratio of GR1 peak:ND1 peak, indicating the ratio of $V^0$:$V^-$ defects is higher for spectrum A (example 3) than for spectrum B (example 6).

| Example Number | CVD Growth chemistry (+initial treatment e.g. high T anneal) | $N_s^0$ conc. in the provided CVD diamond (ppm) | Percentage of integrated absorption in visible spectrum of provided CVD diamond, attributable to defects other than $N_s^0$ | Abs at 270 nm | Abs at 350 nm | Abs at 510 nm | $V^0$ conc (ppm) | $V^-$ conc (ppm) | Colour pre-irradiation in the provided diamond (Colour grade if 0.5 ct RBC) | Irradiation dose | $V^0$ conc (ppm) post irrad | $V^-$ conc (ppm) post irrad | Observed colour after irradiation | Colour characteristics (c*, L* and α) |
|---|---|---|---|---|---|---|---|---|---|---|---|---|---|---|
| 1* | Traditional CVD growth process no treatment | 0.4 | 91.6 | 2.23 | 1.09 | 0.45 | <0.003 | <0.003 | Pale brown | $2.6 \times 10^{17}$ e−/cm² | 0.25 | 0.12 | Dull brownish blue | L* = 54.8<br>C* = 9.88<br>α = 94.41° |
| 2* | High Purity CVD growth process (low X-defects-brown-and low nitrogen)- no treatment | 0.012 | 98.5 | 0.15 | 0.13 | 0.060 | <0.003 | <0.003 | Colourless | $9.7 \times 10^{16}$ e−/cm² | 0.093 | 0.0054 | Colourless | L* = 84.9<br>C* = 1.7<br>α = 74.6° |
| 3 | High Purity CVD growth process (low X-defects-brown-and low nitrogen)- no treatment | 0.012 | 98.5 | 0.15 | 0.13 | 0.060 | <0.003 | <0.003 | Colourless | $2.4 \times 10^{17}$ e−/cm² | 0.17 | 0.006 | Pale, bright greenish blue | L* = 75.8<br>C* = 3.7<br>α = 179.5° |

| Example Number | CVD Growth chemistry (+initial treatment e.g. high T anneal) | $N_s^0$ conc. in provided CVD diamond (ppm) | Percentage of integrated absorption in visible spectrum of provided CVD diamond, attributable to defects other than $N_s^0$ | Abs at 270 nm | Abs at 350 nm | Abs at 510 nm | $V^0$ conc (ppm) | $V^-$ conc (ppm) | Colour pre-irradiation (Colour grade if 0.5 ct RBC) | Irradiation dose | $V^0$ conc (ppm) post irradiation | $V^-$ conc (ppm) post irradiation | Observed colour after irradiation | Colour characteristics (c*, L* and α) |
|---|---|---|---|---|---|---|---|---|---|---|---|---|---|---|
| 4* | High Purity CVD growth process (low X-defects-brown-and low nitrogen)- no treatment | 0.012 | 98.5 | 0.15 | 0.13 | 0.060 | <0.003 | <0.003 | Colourless | $1.9 \times 10^{18}$ e−/cm² | 0.68 | 0.020 | Vivid, bright greenish blue | L* = 61.4<br>C* = 20.2<br>α = 195.7° |
| 5* | Added oxygen CVD growth process- low brown | 0.35 | 71.6 | 1.42 | 0.63 | 0.23 | <0.003 | <0.003 | Pale yellow | $6.5 \times 10^{16}$ e−/cm² | 0.049 | 0.052 | Colourless | L* = 80.97<br>C* = 4.75<br>α = 83.5° |

-continued

| # | Process | | | | | | | | | | | | |
|---|---|---|---|---|---|---|---|---|---|---|---|---|---|
| 6 | Added oxygen CVD growth process-low brown | 0.35 | 71.6 | 1.42 | 0.63 | 0.23 | <0.003 | <0.003 | Pale yellow | $2.4 \times 10^{17}$ e-/cm² | 0.19 | 0.082 | Pale blue-green | $L^* = 80.7$ $C^* = 3.21$ $\alpha = 142.1°$ |
| 7* | Added oxygen CVD growth process-low brown | 0.35 | 71.6 | 1.42 | 0.63 | 0.23 | <0.003 | <0.003 | Pale yellow | $1.9 \times 10^{18}$ e-/cm² | 1.1 | 0.3 | Vivid, bright blue-green | $L^* = 54.3$ $C^* = 19.3$ $\alpha = 189.6°$ |
| 8 | Traditional CVD growth process + HPHT anneal | 0.4 | 91.6 | 2.23 (0.37 post HPHT anneal) | 1.09 (0.13 post HPHT anneal) | 0.45 (0.04 post HPHT anneal) | <0.003 | <0.003 | Pale brown pre HPHT anneal, pale yellow after HPHT anneal | $2.4 \times 10^{17}$ e-/cm² | 0.51 | | Pale greenish blue | |
| 9* | High Purity CVD growth process (low X-defects- brown- and low nitrogen)-no treatment neutron irradiated | 0.012 | 98.5 | 0.15 | 0.13 | 0.060 | <0.003 | <0.003 | Colourless | $1 \times 10^{16}$ n/cm² | | 0 (within error of measurement) | Vivid green yellow | $L^* = 48.4$ $C^* = 25.23$ $\alpha = 135.1°$ |

*Comparative example

The invention claimed is:
1. A fancy pale blue or fancy pale blue/green CVD synthetic single crystal diamond having a boron concentration [B] of <5×10$^{15}$ atoms/cm$^3$ and the following colour characteristics:

| Characteristic | Range |
| --- | --- |
| Hue angle α | 100-270 |
| Saturation C* | At least 2 and at most 10 |
| Lightness L* | >65. |

2. A fancy pale blue or fancy pale blue/green CVD synthetic single crystal diamond material according to claim 1, having a total vacancy concentration [V$_T$] and a path length, L such that the product [V$_T$]×L is at least 0.072 ppm cm and at most 0.36 ppm cm.

3. Diamond material according to claim 1, having (i) an absorption coefficient measured at 77 K of at least 0.01 cm$^{-1}$ at a wavelength of 741 nm; and (ii) an absorption coefficient measured at 77 K of at least 0.01 cm$^{-1}$ at a wavelength of 394 nm.

4. A method of making fancy pale blue or fancy pale blue/green CVD single crystal diamond material, the method comprising:
  irradiating single crystal diamond material that has been grown by a CVD process, has a [N$_s^0$] concentration less than 1 ppm, and is colourless, or is colour-graded brown or yellow, and if colour-graded brown has a colour grade for a 0.5 ct Round Brilliant Cut diamond stone of G (brown) or better, and if colour-graded yellow has a colour grade for a 0.5 ct Round Brilliant Cut diamond stone of T (yellow) or better, with electrons to introduce isolated vacancies into the diamond material,
  the irradiated single crystal CVD diamond material having, or after a further post irradiation annealing treatment having, a total vacancy concentration [V$_T$] and a path length, L such that the product of the total isolated vacancy concentration x path length, [V$_T$]×L is at least 0.072 ppm cm and at most 0.36 ppm cm, and wherein the diamond material becomes fancy pale blue or fancy pale blue/green in colour and has a boron concentration [B] of <5×10$^{15}$ atoms/cm$^3$ and the following colour characteristics:

| Characteristic | Range |
| --- | --- |
| Hue angle α | 100-270 |
| Saturation C* | At least 2 and at most 10 |
| Lightness L* | >65. |

5. A method according to claim 4, wherein the diamond material is colour-graded brown or yellow, and if colour-graded brown has a hue angle in the range 0° to less than 90° for a 0.5 ct Round Brilliant Cut diamond stone, and if colour-graded yellow has a hue angle in the range 90°-130° for a 0.5 ct Round Brilliant Cut diamond stone.

6. A method according to claim 4, wherein there is no further post irradiation treatment, and the dose of electrons is selected so as to introduce the product of total isolated vacancy concentration x path length, [V$_T$]×L in the irradiated diamond material of at least 0.072 ppm cm and at most 0.36 ppm cm.

7. A method according to claim 4, comprising an additional step of post-irradiation treating the irradiated diamond material so as to achieve the product of total isolated vacancy of at most 0.36 ppm cm.

8. A method according to claim 7, wherein the post-irradiation treatment step comprises annealing the irradiated diamond material at a temperature of at least 300° C. and at most 600° C.

9. A method according to claim 8, wherein the dose of electrons is selected so as to introduce the product of total isolated vacancy concentration×path length, [V$_T$]×L in the irradiated diamond material of at most 0.72 ppm cm prior to the post-irradiation treatment step.

10. A method according to claim 4, wherein with respect to the diamond material prior to irradiation, if the total integrated absorption in the visible range from 350 nm to 750 nm that is attributable to defects other than N$_s^0$ is greater than 90% then the absorption coefficient at 350 nm is less than 0.5 cm$^{-1}$ and the absorption coefficient at 510 nm is less than 0.3 cm$^{-1}$.

11. A method according to claim 4, comprising growing a precursor diamond material for use directly, or after further treatment, as the diamond material for irradiation, the precursor diamond material having an absorption spectrum with a total integrated absorption in the visible range from 350 nm to 750 nm such that at most 90% of the integrated absorption is attributable to defects other than [N$_s^0$].

12. A method according to claim 11 wherein the CVD process includes adding oxygen in a process gas at a concentration of >10000 ppm of oxygen molecules in the gas phase.

13. A method according to claim 11, wherein the step of growing precursor diamond material comprises providing a substrate and a source gas; and allowing homoepitaxial diamond synthesis on the substrate to wherein the synthesis environment comprises nitrogen at an atomic concentration of from about 0.4 ppm to about 50 ppm; and wherein the source gas comprises: (a) an atomic fraction of hydrogen H$_f$, from about 0.4 to about 0.75; (b) an atomic fraction of carbon, C$_f$, from about 0.15 to about 0.3; (c) an atomic fraction of oxygen, O$_f$, from about 0.13 to about 0.4; wherein H$_f$+C$_f$+O$_f$=1; wherein the ratio of atomic fraction of carbon to the atomic fraction of oxygen C$_f$:O$_f$, satisfies the ratio of about 0.45:1<C$_f$:O$_f$<about 1.25:1; wherein the source gas comprises hydrogen atoms added as hydrogen molecules, H$_2$, at an atomic fraction of the total number of hydrogen, oxygen and carbon atoms present of between 0.05 and 0.4; and wherein the atomic fractions H$_f$, C$_f$ and O$_f$ are fractions of the total number of hydrogen, oxygen and carbon atoms present in the source gas.

14. A method according to claim 4, wherein a target [N$_s^0$] concentration is predetermined according to the desired final colour of the irradiated diamond material, and the actual [N$_s^0$] concentration in the provided CVD diamond material is controlled to within 20% of the target [N$_s^0$] concentration.

15. A method according to claim 4, comprising growing a precursor diamond material, and then annealing the grown CVD diamond material at a temperature of at least 1600° C. prior to the irradiation step.

16. A method according claim 4, wherein the irradiated diamond material, or the irradiated diamond material after a further post-irradiation treatment, has (i) an absorption coefficient measured at 77 K of at least 0.01 cm$^{-1}$ at a wavelength of 741 nm; or (ii) an absorption coefficient measured at 77 K of at least 0.01 cm$^{-1}$ at a wavelength of 394 nm.

17. A method according to claim 4, wherein the irradiation dose is 1×10$^{17}$–1×10$^{18}$ e$^-$cm$^{-2}$ for a 0.5 ct Round Brilliant Cut diamond stone.

18. A method according to claim 4, wherein the diamond material prior to irradiation shows a measurable difference in at least one of its absorption characteristics in first and second states, the first state being after exposure to irradiation having an energy of at least 5.5 eV and the second state being after thermal treatment at 798K (525° C.), and wherein post irradiation the change in colour saturation value C* between the diamond material in the first and second states is reduced by at least 0.5.

19. A method according to claim 4, wherein post irradiation, the change in C* of the diamond material in first and second states is less than 1, the first state being after exposure to irradiation having an energy of at least 5.5 eV and the second state being after thermal treatment at 798K (525° C.).

20. A method according to claim 4, comprising selecting the $[N_s^0]$ concentration of the diamond material so as to provide a target $V^-/V^0$ ratio in the diamond material.

21. A system for being able to select and make a desired colour of diamond material within the fancy blue to blue/green colour range, having a hue angle within the range 100°-270°; the system comprising the steps of:
  (a) predetermining a target $[N_s^0]$ concentration for a grown CVD diamond material, that after irradiation of that grown CVD diamond material will result in the said desired colour;
  (b) growing diamond material by a CVD process that includes introducing sufficient nitrogen in a process gas in the CVD process so as to achieve the said target $[N_s^0]$ concentration in the grown CVD diamond material, which grown CVD diamond material has the properties of the grown CVD diamond material set forth in claim 4; then
  (c) carrying out the method of claim 4 on the grown CVD diamond material to produce the diamond of claim 1.

* * * * *